(12) United States Patent
Glenn (10) Patent No.: US 6,313,396 B1
(45) Date of Patent: Nov. 6, 2001

(54) LIGHTWEIGHT SOLAR MODULE AND METHOD OF FABRICATION

(75) Inventor: Gregory S. Glenn, Pacific Palisades, CA (US)

(73) Assignee: The Boeing Company, Seattle, WA (US)

( * ) Notice: Subject to any disclaimer, the term of this patent is extended or adjusted under 35 U.S.C. 154(b) by 0 days.

(21) Appl. No.: 09/576,651

(22) Filed: May 22, 2000

(51) Int. Cl.[7] ........................ H01L 31/05; H01L 31/042
(52) U.S. Cl. ................. 136/244; 136/251; 136/256; 257/433
(58) Field of Search ....................... 136/244, 251, 136/256; 257/433

(56) References Cited

U.S. PATENT DOCUMENTS

| | | |
|---|---|---|
| 4,083,097 | 4/1978 | Anagnostou et al. . |
| 5,185,042 | 2/1993 | Ferguson . |
| 5,320,685 * | 6/1994 | Hilgarth et al. ................... 136/259 |
| 5,407,491 | 4/1995 | Freudlich et al. . |
| 5,616,185 | 4/1997 | Kukulka . |
| 5,660,646 * | 8/1997 | Kataoka et al. ................... 136/251 |
| 5,800,630 | 9/1998 | Vilela et al. . |

* cited by examiner

Primary Examiner—Alan Diamond
(74) Attorney, Agent, or Firm—DiPinto & Shimokaji, P.C.

(57) ABSTRACT

A solar cell module comprises a substrate and a first solar cell supported by the substrate, with the first solar cell having a first top side and a first rear side. A second solar cell is supported by the substrate and has a second top side and a second rear side, with the second solar cell being operatively adjacent the first solar cell. A first tab is affixed to either the first or second top side and operatively interfaces with a respective one of the first or second rear side. A bonding element is disposed between the substrate and first and second rear sides. The bonding element directly bonds (a) the substrate to one of the first and second rear sides and (b) the substrate to the tab. A first metal trace element is disposed between the substrate and first and second solar cells, with the metal trace electrically connecting one of the first and second top sides to one of the first and second rear sides with a conducting element.

25 Claims, 6 Drawing Sheets

LIGHTWEIGHT SOLAR MODULE AND METHOD OF FABRICATION

BACKGROUND OF THE INVENTION

1. Field of the Invention

The present invention generally relates to solar cell modules. More specifically, the invention relates to an improved solar cell module that is inexpensive and lightweight, as well as a method of making the same.

2. Description of Related Art

With the ready availability of solar energy in outer space for a spacecraft such as a satellite, the conversion of solar energy into electrical energy with photovoltaic cells is an obvious choice for producing power. Solar energy is also a major consideration for producing electrical power in terrestrial applications, as costs associated with more traditional power plants increase yearly. Higher efficiency in power conversion of sunlight to electricity equates to either lighter weight spacecraft or higher payload capacity, both of which have monetary benefit. Higher efficiency in terrestrial systems equates to higher system efficiency, which reduces balance of system costs, such as land area, support structures and wiring. One method for increasing efficiency is to manufacture solar cells with multiple junctions, or layers having different energy band gaps which have been stacked so that each cell or layer can absorb a different part of the wide energy distribution in the sunlight. Because of the high voltage of these cells compared to silicon and their susceptibility to reverse bias breakdown, there is a requirement to protect each cell with a bypass diode. Attachment of the diode to each cell is in addition to attaching interconnects for the purpose of increasing voltage in a solar cell circuit by series connection.

Past connection of cells, however, have involved multiple interconnects and diode tabs. The diode tab has commonly been a separate strip of metal, which has been wrapped around from the top to rear sides of the cell. This has required much handling, attaching, and cleaning operations, which increase the cost of manufacturing the solar module and results in solar cell attrition due to handling.

Some interconnection methods have used monolithic, metallized wraparound or wrapthrough areas, which allow access to both positive and negative cell polarities on the rear of the cell. This method involves evaporating the metal wraparound or wrapthrough in an evaporation chamber. A disadvantage to this metal wraparound has been the associated cost of lasing or micro-blasting a via for the metal, etching and photolithographic steps required to monolithically attach and insulate the metal wraparound to the cell. Another disadvantage to the wraparound process is the tendency to shunt the cell through defects in the thin dielectric used to insulate the evaporated metal wraparound.

Traditionally, once the individual solar cells have been interconnected in a string, the string has been bonded to a 2-facesheet honeycomb substrate. Wiring the cell strings together in series for higher voltage or in parallel for higher current has typically been accomplished by the use of insulated wire and soldered joints. However, this method of soldering involves a time consuming set of manual processes which require inspection, rework and cleaning. Along with being time consuming, those steps also lead to attrition of the fragile and expensive solar cells.

Furthermore, solar cell panels must be designed robust to survive the rigors of the space environment. The individual solar cells and their substrate can be subject to significant mechanical vibration during a launch and thermal cycling during the course of the spacecraft's mission in space. The thermal cycling, in turn, leads to thermal expansion and contraction of the various materials. This can cause stress on the components of the solar cell panel if there is a coefficient of expansion (CTE) mismatch between the component materials. With greater stress in terms of frequency and magnitude, there can be a shorter life expectancy of the panel. Ultimately, the spacecraft on which the solar panel is used will have a shorter life and result in greater costs to replace it.

Past designs of solar cell panels that attempt to address one or more of the above performance and manufacturing issues have been numerous, including U.S. Pat. No. 4,083,097. Therein, a method of making encapsulated solar cell modules includes a polymer cover film that is molded to provide an embossed surface having depressions arranged in a row. Each depression has the same configuration as a solar cell. Solar cells with positive and negative contacts on the back surface are preferred and can be positioned in the depressions with the front surfaces of the cells that face the light source contacting the bottom of the depressions. A second polymer film having interconnecting circuitry metallization is placed over the back surfaces of the cells so that the cells are electrically connected. A disadvantage, however, is the lack of direct bonding between the back surfaces of the cells and the second polymer film, which leads to a greater potential for separation from the metallization. Another disadvantage is that the device may not work in a severe thermal environment, such as outer space where thermal expansion will result in a loss of electrical connection.

A solar panel using a printed circuit substrate is shown in U.S. Pat. No. 5,185,042. Solar cells are physically and electrically connected to a substrate via interconnect pads. Positive and negative terminals on the back side of the cells are preferably connected by soldering to the interconnect pads. If the terminals are on opposite sides of the cells, metallic interconnectors may be used to connect terminals on the tops sides, over the cell edges, and to the interconnect pads, even though the specific fashion is not described. An adhesive may optionally secure the cells to the substrate, although, again, the particular manner is not described. Stress relief loops bound the interconnect pads to electrical traces encapsulated in the substrate. This results in the solar cells being effectively mounted to the substrate on coiled springs. On the back side of the substrate, electrically conductive mounting pads enable attachment to elements such as blocking and shunting diodes. If the cell is soldered to the spring shaped conductor then the solder could bridge across the spring, thus making it lose its advantage as an absorber of thermal stresses. Another disadvantage is that the configuration of a coiled loop provides a relatively weak structure that is susceptible to structural failure when stressed and, thus, electrical connection failure. Yet another disadvantage is that this design requires either a wrapthrough metal configuration to bring both cell contacts to the rear side of the solar cells or a tab. The tab type described in the patent bridges off the cell onto an adjacent conductive pad, which increases the area required for a solar array of a given power design. The wrapthrough metal configuration has disadvantages, which have been described above.

As can be seen, there is a need for an improved solar cell module and method of making the same. A further need is for a solar cell module that is lightweight, yet inexpensive to manufacture. Another need is for a solar cell module that provides a low cost, top-to-rear side connection of cells having a bypass diode. Yet another need is for a method of making solar cell panels which reduces the need for handling, attaching, and cleaning operations to facilitate automation. A method of making solar cell panels is needed, which also eliminates the need for lasing or micro-blasting, etching and photolithographic steps otherwise required to monolithically attach and insulate a metal wraparound to the cell. An apparatus and method is further needed that minimizes the potential of shunting cells through defects in the dielectric that insulates the metal wraparound from the cell substrate.

SUMMARY OF THE INVENTION

The present invention is directed to an improved solar cell module, comprising a substrate and a first solar cell supported by the substrate, with the first solar cell having a first top side and a first rear side. A second solar cell is supported by the substrate and has a second top side and a second rear side, with the second solar cell being operatively adjacent the first solar cell. A first tab is affixed to either the first or second top side and operatively interfaces either the first and rear bottom side. A bonding element is disposed between the substrate and first and second rear sides. The bonding element directly bonds (a) the substrate to one of the first and second rear sides and (b) the substrate to the tab. A first metal trace element is disposed between the substrate and first and second solar cells, with the metal trace electrically connecting one of the first and second top sides to one of the first and second rear sides.

In another aspect of the invention, a method of making a solar cell module comprises positioning a first solar cell adjacent a second solar cell. One plurality of conducting elements in a first pattern is applied on the first solar cell. Another plurality of conducting elements in a second pattern is applied on the second solar cell. A bonding element is adhered onto the first and second solar cells, with the bonding element having a plurality of openings arranged in the first and second patterns. The conducting elements are aligned with the openings. A plurality of metal trace elements is placed on a substrate and then the metal trace elements are contacted with the conducting elements.

These and other features, aspects and advantages of the present invention will become better understood with reference to the following drawings, description, and claims.

DESCRIPTION OF THE PREFERRED EMBODIMENTS

The improved solar cell module 10 and method of making the same is described below in various preferred embodiments. However, other embodiments are contemplated. Further, while the present invention may be particularly useful in the context of spacecraft, such as in a solar panel of a satellite, other applications—both terrestrial and non-terrestrial—are contemplated.

Figure 1:
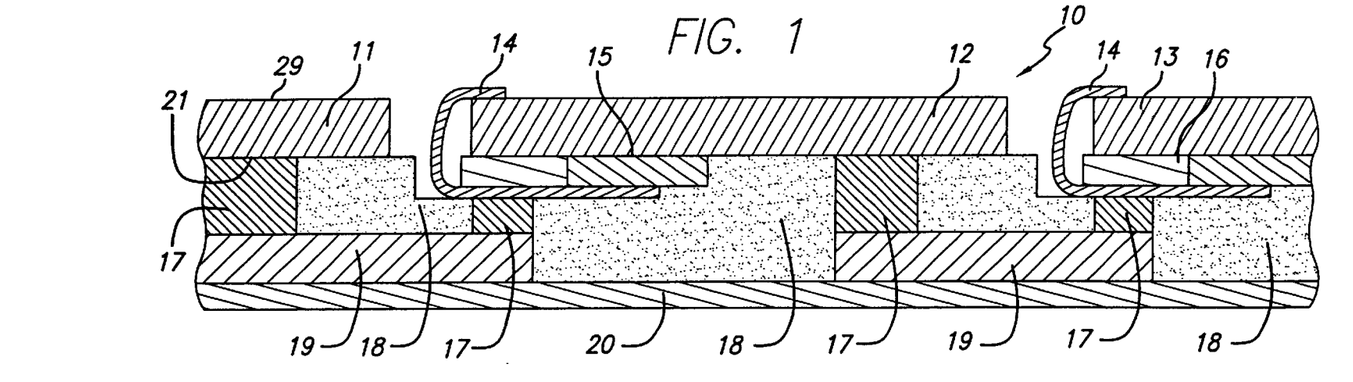
FIG. 1 is a schematic cross sectional view of a solar cell module according to an embodiment of the present invention.

FIG. 1 is a schematic side, cross-sectional view of a first embodiment of the solar cell module 10. For purposes of illustration, only three solar cells—a first solar cell 11, a second solar cell 12, a third solar cell 13—are depicted. Of course, the number of solar cells can vary according to the particular application of the module 10. As shown in FIG. 1, the solar cells 11–13 are generally positioned in a common plane and operatively adjacent to one another. The solar cells 11–13 are constructed with designs well known in the art, such as that shown in U.S. Pat. Nos. 5,800,630 and 5,407,491. Although it can vary, each of the solar cells 11–13 is described by a rear side 21 and a top side 29, while typically being on the order of about 7 mils thick.

A bypass diode 15 (or a switching device in the case of smart solar panels) is preferably attached, such as by soldering or conductive adhesive, to the rear side 21 of each of the solar cells 11–13 to minimize the effects of a reverse bias voltage. The use of bypass diodes is known in the art and shown, for example, in U.S. Pat. No. 5,616,185. Yet, the present invention contemplates that not all of the solar cells 11–13 have an associated bypass diode 15.

Figure 3A:
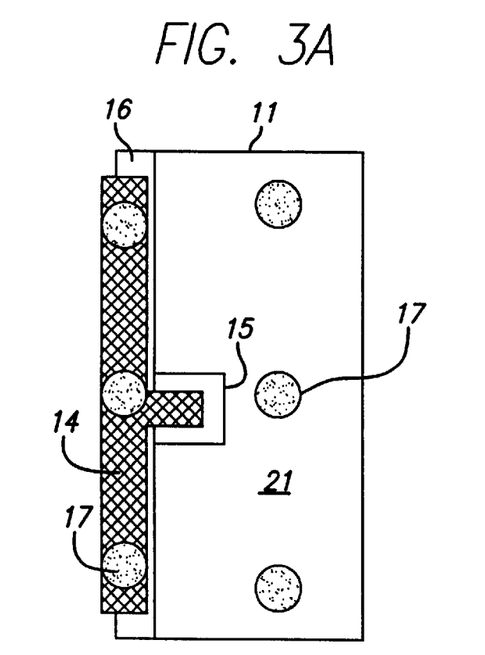
FIGS. 3A–B are diagrams depicting a portion of a process according to the present invention for making the solar cell module shown in FIG. 1.
Figure 3B:
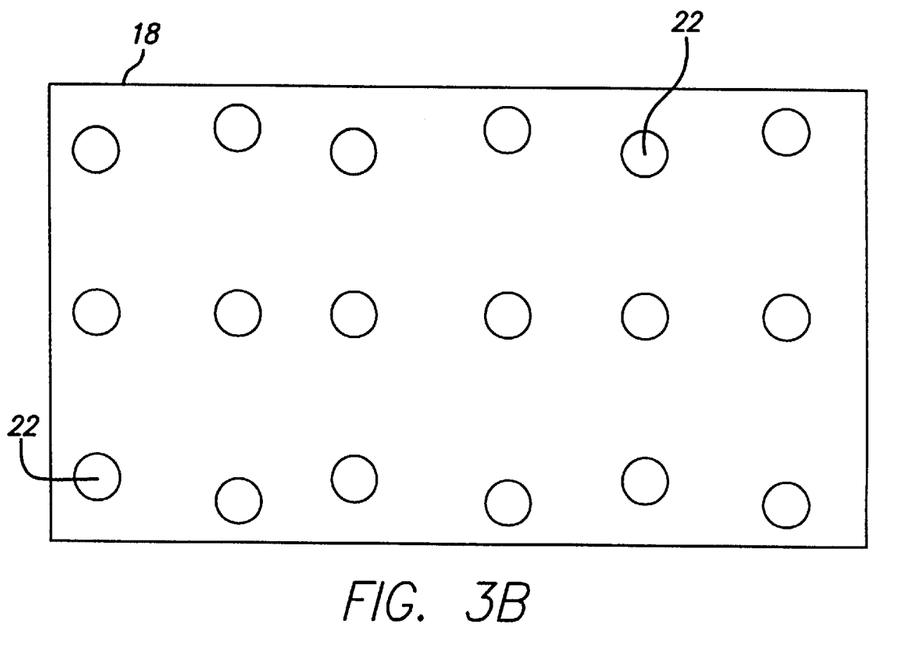

Each bypass diode 15 is supported by a planar tab 14. As better shown in FIG. 3, the tab 14 preferably has a mesh configuration to provide stress relief during thermal cycling and is constructed of a conductive material such as silver plated Kovar™, Invar™ or molybdenum. A preferred configuration for the tab 14 is generally a main rectangular portion with a smaller secondary rectangular portion at one of the edges of the main portion. The main portion of the tab 14 is affixed to a conductive element, or ohmic bar (not shown), at the top side 29 of the cell 11–13, such as by welding. From the top side 29, the main portion of the tab 14 wraps around but is not in contact with the edge of the cell 11–13. The secondary or diode portion of the tab 14 interfaces the rear side 21. The secondary portion is also affixed to a side of the bypass diode 15 opposite the rear side 21, such as by welding. The diode 15 is electrically attached to the back of the cell by solder, conductive adhesive or other conducting means. Thereby, the diode 15 is positioned directly between the tab 14 and the rear side 21 of the cell 11–13.

While in this preferred embodiment, a wraparound tab 14 is affixed to each cell 11–13, it is also contemplated that not each cell 11–13 has a tab 14. For example, in a string of cells 11–13, a cell at the end of the string may have a tab that does not wraparound. Cells made from material such as silicon do not need a bypass diode on each cell, but may have them incorporated into the circuit in intervals of, for example, 10 cells. Thus, the end cell may have a "straight" tab that electrically connects the end cell to a tubule 26 that carries away electrical current, as described below.

In referring again to FIG. 1, an insulating or dielectric element 16 is positioned immediately adjacent to the bypass diode 15 and directly between the tab 14 and the rear side 21 of the cell 11–13. While its thickness can vary, the insulating element 16 is preferably about 0.5 to 2.5 mils thick. The insulating element 16 prevents electrical shorting of the cell 11–13 due to the tab 14 wrapping around the cell 11–13. Accordingly, the insulating element 16 can be made from various dielectric materials such as polyimide film and Kapton™ by Dupont.

A bonding element 18 is disposed immediately underneath of and adhered to portions of the rear side 21 of the cell 11–13 and portions of the tab 14, when viewed from FIG. 1. The bonding element 18 is further adhered to a flexible substrate 20 that supports the solar cells 11–13, as further described below. Thus, the bonding element 18 is directly between and, thus, directly bonds the substrate 20 and the tab 14, as well as the substrate 20 and the rear side 21. The general function of the bonding element 18 is to mechanically bond the solar cells 11–13 to one another, as well as to the substrate 20. More specifically, the bonding element 18 mechanically bonds the tab 14 on one cell to an adjacent cell 11–13 at the rear side 21, the tab 14 to the substrate 20, the tab 14 to metal traces 19 described below, and the rear side 21 of the cells 11–13 to the substrate 20.

As better seen in FIG. 3B, the bonding element 18 is preferably of a sheet construction and has a plurality of openings 22 that are in a pattern, the functioning of such patterned openings being further described below. Given its general bonding function, the bonding element 18 can be made of adhesive materials such as silicone, urethane or epoxy. Although the bonding element 18 can have a varying thickness depending upon the particular application, the thickness is typically in the range of about 4 to 15 mils.

Figure 4:
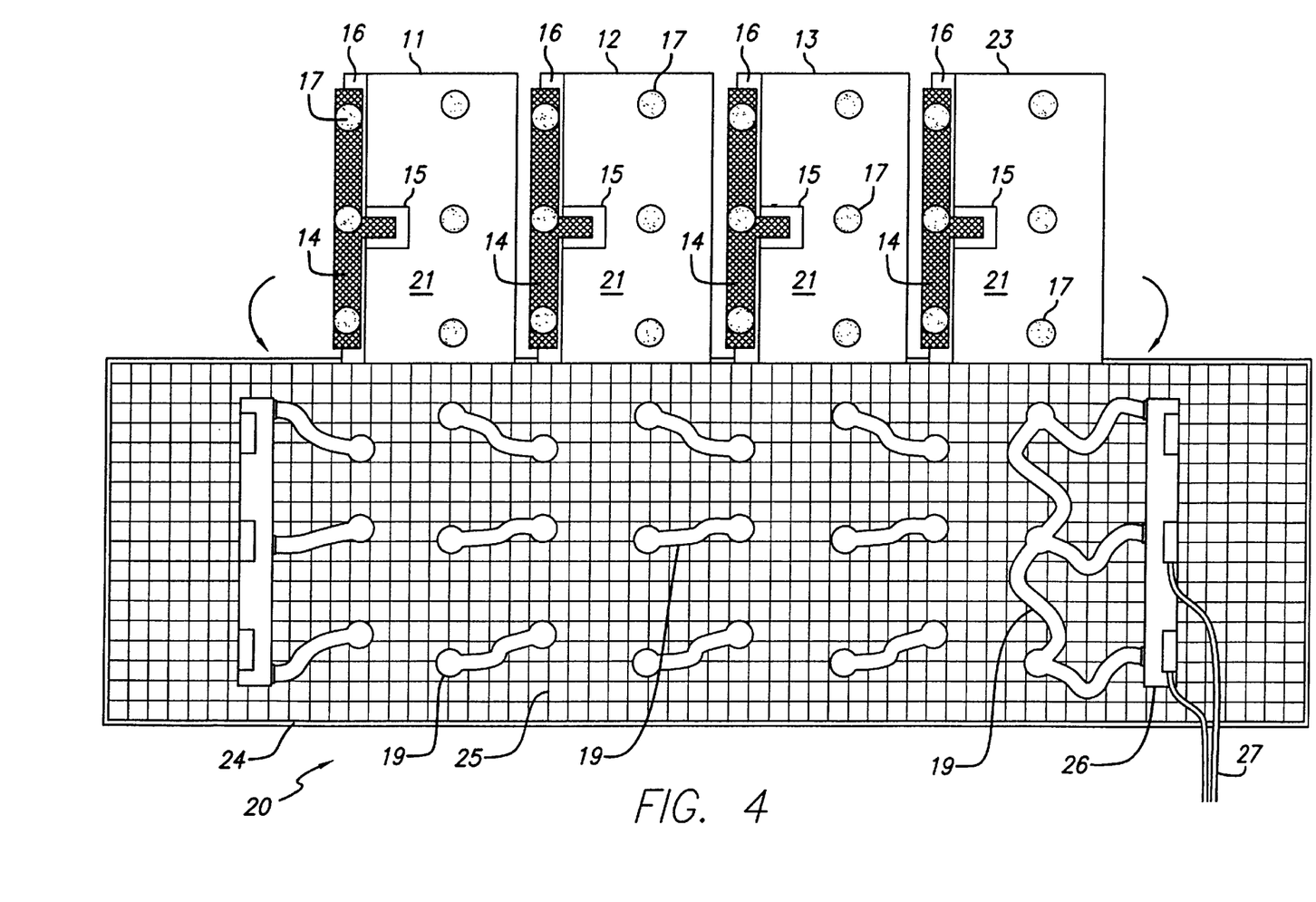
FIG. 4 is a diagram depicting another portion of a process according to the present invention for making the solar cell module shown in FIG. 1.

A plurality of conducting elements 17 is immediately underneath and in contact with each tab 14 and each rear side 21 of the cells 11–13, when viewed from FIG. 1. It can be seen in FIG. 3 that the conducting elements 17 on the first solar cell 11 are provided as spots in a conducting pattern which preferably matches part of the opening pattern 22 in the bonding element 18. The remainder of the opening pattern is preferably matched to the other conducting patterns associated with the remaining solar cells, as shown in FIG. 4. It can be noted, however, that FIG. 4 further depicts a fourth solar cell 23 for purposes of illustration. To provide electrical conduction, the conducting elements 17 can be made of a conducting material such as a metal loaded conductive adhesive or solder. The thickness of the conducting elements 17 should be at least as thick as the bonding element 18 so that the conducting elements 17 can extend through the openings 22 and make electrical contact with metal traces 19 described below. Thereby, the conducting elements 17 provide electrical connection between the metal traces 19 and the rear sides 21.

While FIG. 4 depicts in this embodiment each conducting element 17 in the configuration of a spot, other configurations can be used. Also, even though FIGS. 3B and 4 depict each conducting element 17 correlating to an opening 22 in the bonding element 18, the present invention contemplates that not every conducting element 17 must correlate to an opening 22. Further, while the conducting pattern on each of the cells 11–13, 23 is depicted in FIG. 4 as being the same, the present invention envisions that the conducting patterns can all be different or some can be the same.

In referring to FIGS. 1, 3A–B, 4 and 5A, the metal traces 19 are provided on the substrate 20 so that the distal ends of the traces 19 preferably match the opening pattern of openings 22 on the bonding element 18 and the conducting pattern of conducting elements 17. As a result, one distal end of a metal trace 19 matches a conducting element 17 affixed to the rear side 21 of a cell 11–13, 23. The other distal end of the metal trace 19 matches a conducting element 17 affixed to the tab 14. In this fashion, and for the embodiment shown in FIG. 4, three metal traces 19 electrically connect one cell to an adjacent cell 11–13, 23. Specifically, three metal traces 19 electrically connect a portion of the tab 14 that interfaces the rear side 21 of one cell to the rear side 21 of an adjacent cell 11–13, 23. Consequently, a top-to-bottom electrical connection is made from one cell to the next among all of the cells 11–13, 23. The metal traces 19 may be made by adhering a sheet of metal to the substrate 20 and then etching a pattern using photoresist and an etchant. For example, the three metal traces 19 between each of two cells 11–13 may be etched into a mesh pattern to better survive a severe thermal environment (FIG. 5B).

Notwithstanding the foregoing, the present invention also contemplates that not each of the distal ends of the metal traces 19 match each opening 22 and/or each conducting element 17. It is also contemplated that more or less than three metal traces 19 can be used to electrically connect one cell to the next.

Figure 5A:
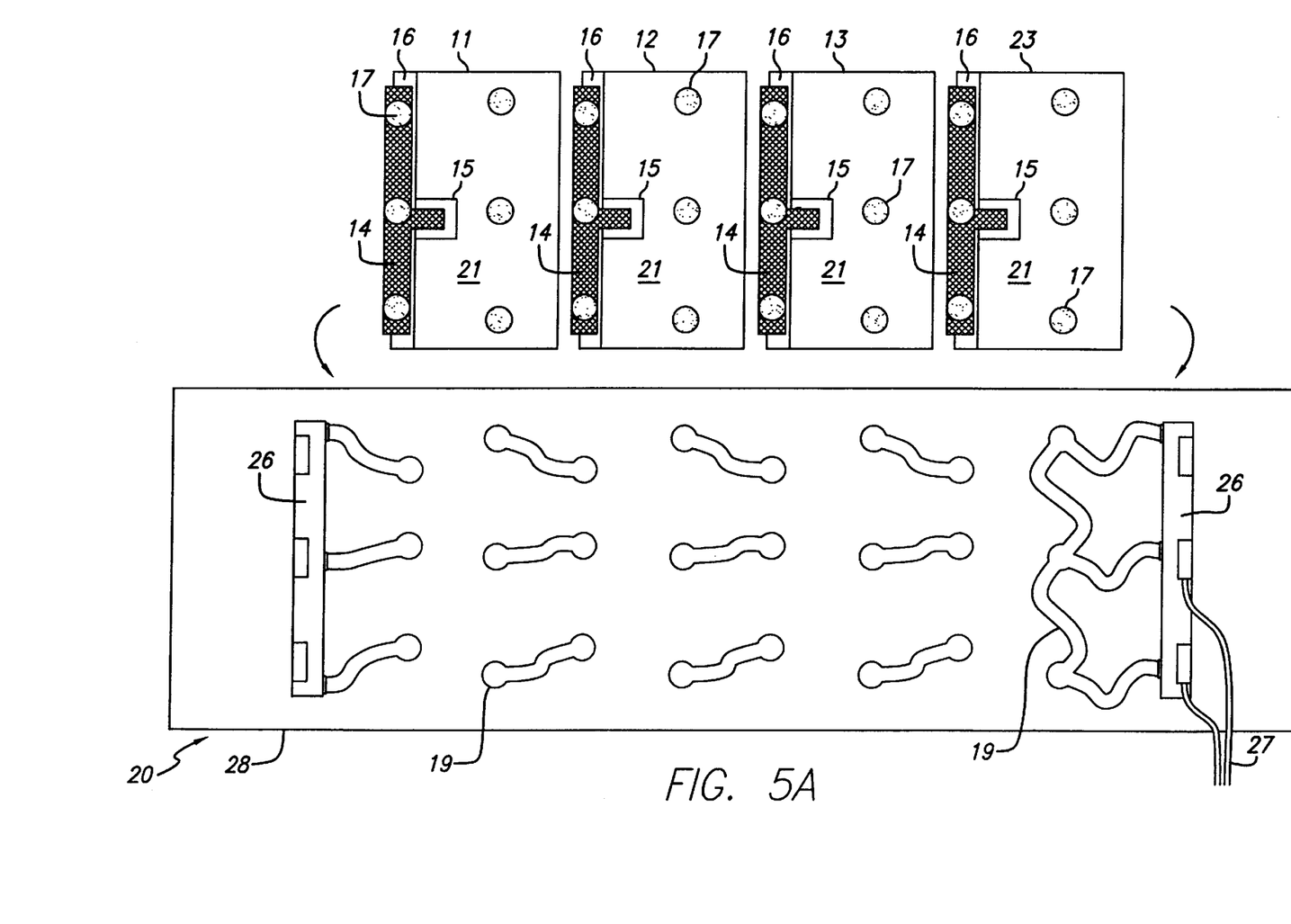
FIGS. 5A–B are diagrams depicting yet a further portion of a process according to the present invention for making the solar cell module shown in FIG. 1.
Figure 5B:
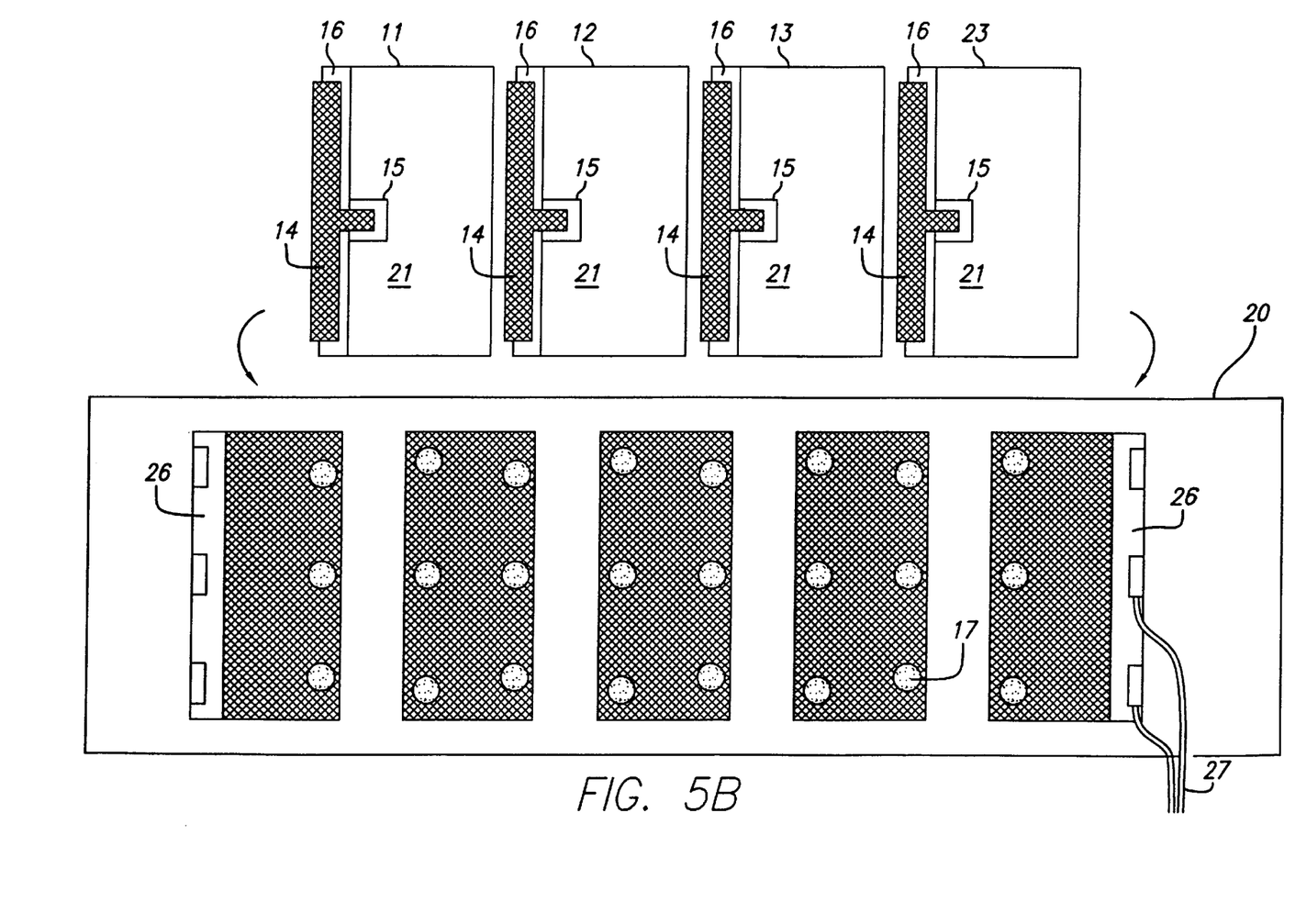

A tubule is formed on a bus bar 26 that is disposed at opposing ends of the substrate 20, as shown in FIGS. 4 and 5A–B. Similar tubules are shown, for example, in U.S. Pat. No. 5,961,737 which is incorporated herein by reference. Each bus bar 26 is affixed to the substrate 20, such as by welding or conductive adhesive, is made of an electrically conductive material, and is electrically connected to immediately adjacent traces 19. Thereby, the electrical current produced by the cells 11–13, 23 is sent through the metal traces 19 and carried away by wires 27 affixed to the tubules formed on the bus bar 26.

The substrate 20 that is juxtaposed to the bonding element 18 supports the foregoing elements of the solar cell module 10 and is preferably made of a lightweight, dielectric material. The substrate is lightweight to save launch costs and is a dielectric to prevent electrical shorting. In the embodiment of FIG. 4, the substrate 20 includes a relatively rigid frame 24 that holds a flexible mesh 25. The frame 24 may be constructed of materials such as graphite, while the mesh 25 may be constructed of materials such as glass fiber or a woven fiber like Kevlar™ by Dupont. In another embodiment shown in FIGS. 5A–B, the substrate 20 is constructed of a material such as a dielectric film 28 like Kapton™ by Dupont, which is adhered to a more rigid substrate, such as graphite or Kevlar™ impregnated with epoxy resin.

Figure 2:
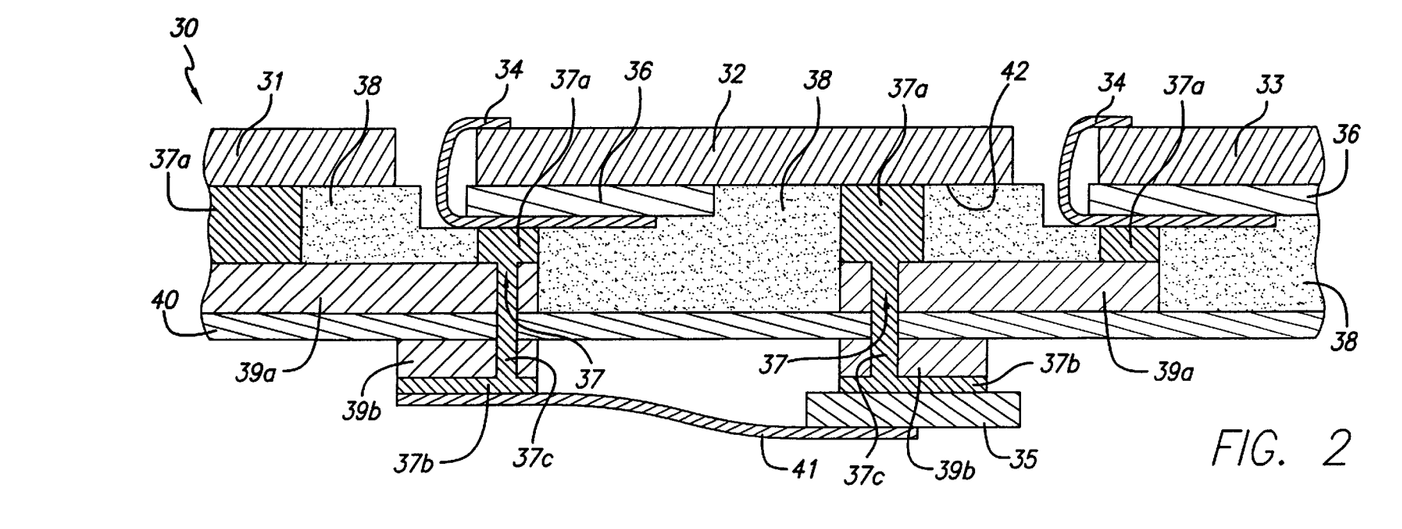
FIG. 2 is a schematic cross sectional view of a solar cell module according to another embodiment of the present invention.

A second embodiment of a solar cell module 30 according to the present invention is shown in FIG. 2. Generally, the second embodiment is the same as the first embodiment shown in FIG. 1, primarily except for the position of a bypass diode 35. In the second embodiment, the bypass diode 35 is located on a side of the substrate 40 opposite the solar cells. In the first embodiment, the bypass diode 15 is located on a side of the substrate 20 that is the same as the solar cells—i.e., between the tab 14 and the rear side 21.

More specifically, the second embodiment of the solar cell module 30 includes a plurality of solar cells, namely, a first solar cell 31, a second solar cell 32, and a third solar cell 33. The solar cells 31–33 are constructed in a fashion similar to the solar cells 11–13 in the first embodiment of FIG. 1. A wraparound tab 34 is constructed like the tab 14 in the first embodiment so that the tab 34 wraps each cell 31–33 from a front side, around the edge of the cell 31–33, and to a rear side 42. But unlike the first embodiment, the tab 34 does not support a bypass diode against the rear side 42 of the cell 31–33. Instead, the tab 34 is juxtaposed to the rear side 42 with only an insulating element 36 therebetween. The insulating element 36 is constructed like the insulating element 16 of the first embodiment.

Like the bonding element 18 above, a bonding element 38 is disposed immediately underneath of and adhered to portions of the rear side 42 of the cell 31–33 and portions of the tab 34, when viewed from FIG. 2. The bonding element 38 is also adhered to a substrate 40, as in the first embodiment. Consequently, the bonding element 38 is constructed and functions like the bonding element 18 above.

Similar to the first embodiment of FIG. 1, a plurality of conducting elements 37 (specifically, a conducting portion 37a of the element 37) is immediately underneath of and in contact with each tab 34 and each rear side 42 of the cells 31–33, when viewed from FIG. 2. Also as in the embodiment of FIG. 1, the conducting elements 37 are provided as spots in a conducting pattern, the totality of which preferably matches the opening pattern in the bonding element 38.

The substrate 40 of FIG. 2 is constructed and designed like the substrate 20 of FIG. 1. Metal traces 39a are provided in the embodiment of FIG. 2 in a fashion similar to the metal traces 19 in FIG. 1. In other words, the metal traces 39a are supported on a side of the substrate 40 that interfaces the rear side 42 of the cells 31–33. However, in contrast to the first embodiment, the second embodiment additionally provides a pair of metal traces 39b associated with each cell 31–33. These metal traces 39b are electrically affixed on a side of the substrate 40 opposite the rear side of the cells 31–33.

In further describing the second embodiment of FIG. 2, a conducting portion 37b of the conducting element 37 extends across a bottom side of the metal traces 39b, when viewed from FIG. 2. A conducting portion 37c of the conducting elements 37 extends from the conducting portion 37b, up through the metal traces 39b, up through the substrate 40, and to respective conducting portions 37a. Below one of the conducting portions 37b is the bypass diode 35. The bypass diode 35 is electrically connected to the other conducting portion 37b via a tab 41.

One preferred method of making the first embodiment of the solar module is shown in FIGS. 3–5B. In accordance with such method, the main portion of the mesh tab 14 is affixed to the ohmic bar (not shown) on the top side 29 of the cell 11–13, 23, such as by welding. The bypass diode 15 is then affixed to the secondary or diode portion of the mesh tab 14, such as by welding. A filtered coverglass (not shown) is then bonded onto the front side 29 of the solar cell with clear adhesive (not shown). The insulating element 16 is then applied to the rear side 21 of the cell 11–13, 23. From the top side 29, the mesh tab is wrapped around to the rear side 21. The bypass diode 15 is then attached to the rear side 21, such as by a solder paste or heat cure conductive epoxy. The above steps are repeated for each of the cells 11–13, 23.

The end bus tabs 26 are affixed to the substrate 20, such as by welding. The solar cells 11–13, 23 are then placed into an indexing fixture with the rear side 21 facing up. The indexing fixture can be of any design that allows the cells to be placed and held in a fixed position relative to one another. For example, the fixture can comprise a machined block of delrin plastic or aluminum with indentations into which the solar cell assemblies can fit.

With the cells positioned in the indexing fixture, the conducting elements 17, such as in the form of conductive adhesive or solder paste, are applied onto to rear sides 21 of each of the cells 11–13, 23. Alternatively, the conducting elements can be applied to the conductive traces 19. Preferably, an automated X-Y-Z dispenser is used to dispense and apply the conducting elements 17 in a pre20 selected conducting pattern. As indicated above, the conducting pattern is preferably the same for each of the cells 11–13, 23, although it can be different.

A bonding element 18, preferably in the form of a heat cure adhesive sheet, such as a B-stage adhesive, is then placed across the conducting elements 17 such that the openings 22 in the opening pattern match the positions of the conducting elements 17 in the conducting pattern. Alternatively, a bonding element 18 in the form of a heat cure adhesive can be dispensed with automated dispensing equipment. The substrate 20 is then positioned relative to the solar cell circuits so that the conductive traces 19 are indexed with the conductive elements 17. The above components including the substrate 20, bus tabs 26, conductive traces 19, bonding element 18, the conducting element 17, the diodes 15, the tabs 14, and the cells 11–13, 23 are placed into a thermal vacuum bag and heated under pressure. The heat and pressure are selected to cause the bonding element 18 to cure and adhere to the cells. At the same time, the conductive adhesive 17 can cure simultaneously with the non-conductive bonding adhesive 18 or the solder 17 can melt.

The solar cell flex-circuit assembly is then removed from the thermal vacuum bag and attached to a frame 24 (FIG. 4) or bonded to a more rigid substrate (not shown). Then, wires 27 are inserted into the tubules formed into the end tabs 26 and welded. Alternatively, the wires 27 can be soldered directly to exposed conductive traces 19 at the ends of the solar cell strings. The wires 27 can then be routed to other solar panels for wiring in series or parallel, or directly to the electrical load.

The pre-punched "B" stage adhesive sheet approach of the invention is an improvement over the conventional mixing and spreading process which takes approximately 24 hours to cure between sector bondings. The fast heat cure process of the present invention would allow, by way of example, an entire panel, say three separate bonding sectors, to be bonded in one day.

Figure 6:
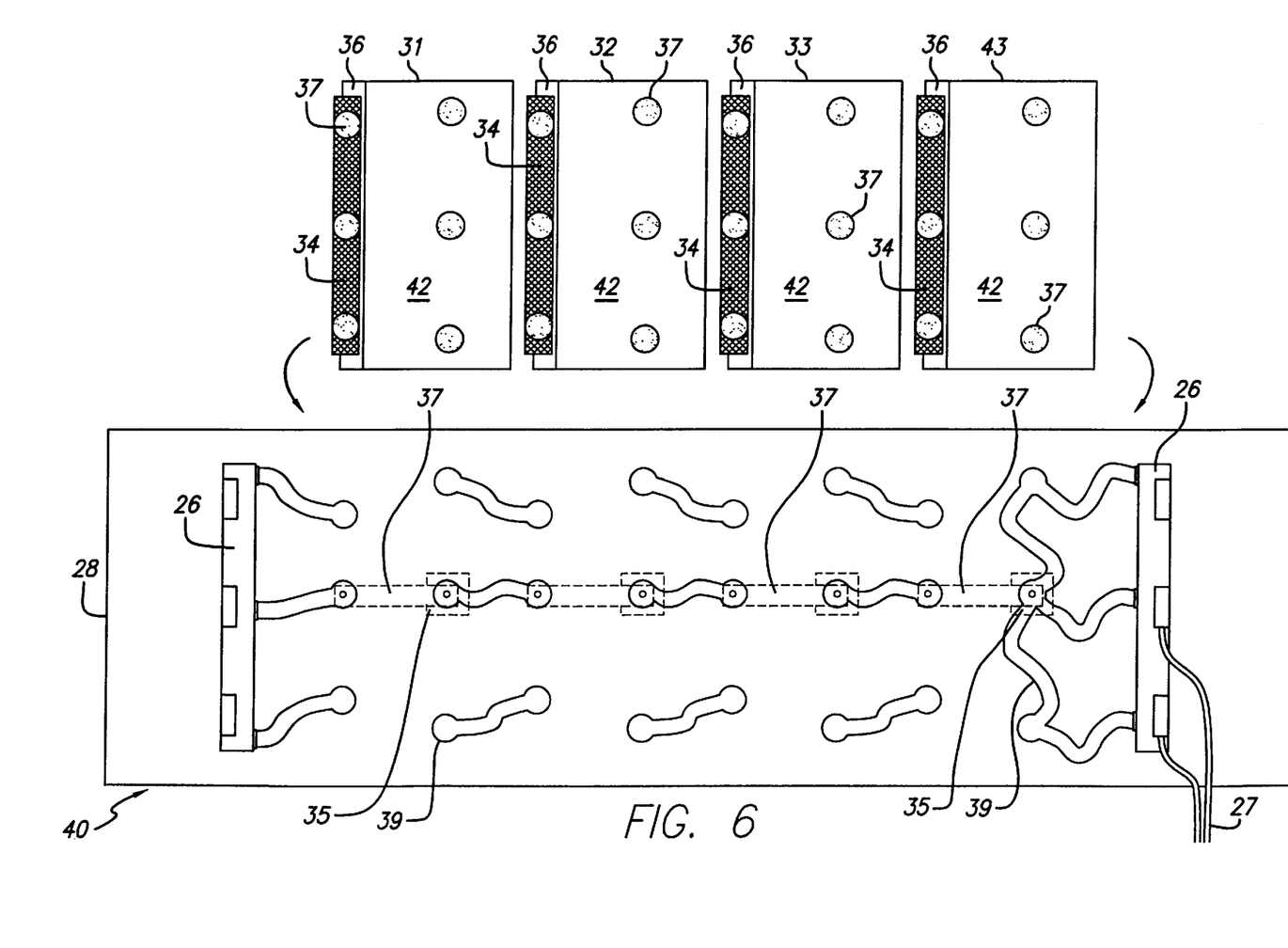
FIG. 6 is a diagram depicting a portion of a process according to the present invention for making the solar cell module shown in FIG. 2.

A second preferred method of the present invention (FIG. 6) produces the second embodiment of the solar cell module 30 depicted in FIG. 2. The second method is essentially the same as the first preferred method above, except that provision is made for the different positioning of the bypass diode 35. Accordingly, this second method omits the above steps of attaching a diode to the tab and attaching the diode to the rear side of the solar cell 42. Instead, metal traces 39a and 39b are formed on the substrate 40 on both sides, such as by etching the pattern from a metal sheet that has been adhered to both sides of the dielectric substrate 40. The bypass diode 35 is affixed to the tab 41, such as by welding, after which the tab 41 and diode 35 are respectively affixed to the conducting portion 37b, such as with solder paste or conductive adhesive. The conductive element 37 is applied to the top surface of conducting traces 39a adjacent to holes through the conducting traces 39a and dielectric substrate 40. When the assembly shown in FIG. 2 is pressed together with heat, such as in a thermal vacuum bag, the conductive element 37 flows through the holes, forms the conducting portions 37a–c, and makes electrical contact with the diode 35 and diode tab 41. The conductive adhesive 37 then cures (or the solder 37 then melts) and solidifies, making electrical connection between the conductive traces 39a and 39b, wraparound tab 34 and diode tab 41, as well as between the traces 39a and 39b, the rearside of the solar cells 31–33 and the top of the diode 35.

As can be seen, the present invention provides an improved solar cell module and method of making the same that can be used in either terrestrial or non-terrestrial applications. The solar cell module according to the present invention is lightweight, yet inexpensive to manufacture.

The present invention provides top-to-rear side connection of solar cells, including those having a bypass diode. The present invention additionally provides a method of making solar cell panels which substantially reduces handling, attaching, and cleaning operations. The method also eliminates the need for lasing or micro-blasting, etching and photolithographic steps otherwise required to monolithically attach and insulate a conductive wraparound tab to the cell. Since the present invention simultaneously electrically connects the cells together as well as bonding them to a substrate, it avoids the need for the conventional series circuit soldering process which comprises a time consuming set of manual processes which require inspection, rework and cleaning. Such steps, besides being time-consuming, lead to attrition of fragile wafers. By contrast, the present invention can be practiced using an electromechanical robot dispenser to accurately dispense a metered amount of conductive adhesive to match the conductive pads of the substrate. This can be done quickly and precisely without direct contact with the fragile wafer and will not require rework or circuit cleaning. The pre-punched "B" stage adhesive sheet approach of the invention is an improvement over the conventional mixing and spreading process which takes approximately 24 hours to cure between sector bondings. The fast heat cure process of the present invention would allow, by way of example, an entire panel, say three separate bonding sectors, to be bonded in one day. The present mesh wraparound tab can replace, for example, three interconnects and two diode tabs in a conventional structure made using a conventional process. This reduces the number of handling, attaching and cleaning operations. Since the invention can be practiced with a conductive epoxy or high temperature solder paste with no-clean flux, the cleaning operations, which are typically required when solder with RMA flux is used, are not required. An apparatus and method according to the present invention minimizes the potential of shunting cells through defects in the dielectric that insulates the conductive wraparound tab from the cell substrate.

Solar panels are now becoming 'smart panels' using electronic switches and power regulation circuitry as components on the solar panel. The present invention is also applicable to such 'smart' panels. Instead of bypass diodes 35, it is contemplated that elements 35 will be switching devices. Consequently, it is intended that the references herein to bypass diodes are also generally applicable to elements such as switching devices.

It should be understood, of course, that the foregoing relates to preferred embodiments of the invention and that modifications may be made without departing from the spirit and scope of the invention as set forth in the following claims.

What is claimed is:

1. A solar cell module, comprising:
   a substrate;
   a first solar cell supported by said substrate and having a first top side and a first rear side;
   a second solar cell supported by said substrate and having a second top side and a second rear side, said second solar cell being operatively adjacent said first solar cell;
   a tab affixed to one of said first and second top sides and operatively interfacing with a respective one of said first and second rear sides;
   a bonding element disposed directly between said substrate and tab; and
   a metal trace element disposed directly between said substrate and said bonding element.

2. The module of claim 1, further comprising at least a first bypass diode disposed on at least one of said first and second rear sides adjacent to a first top side of said substrate which is closer to said first rear side of said first solar cell than a rear side of said substrate.

3. The module of claim 1, further comprising a first bypass diode disposed adjacent to a rear side of said substrate.

4. The module of claim 1, further comprising a plurality of conducting elements positioned between said metal trace element and said first and second solar cells in addition to said tab.

5. The module of claim 1 further comprising an insulating element positioned between said tab and one of said first and second rear sides.

6. The module of claim 1, further comprising another tab affixed to the other of said first and second top sides and to the other of said first and second rear sides.

7. The module of claim 1, further comprising at least a first switching device disposed on at least one of said first and second rear sides adjacent to a first top side of said substrate which is closer to said first rear side of said first solar cell than a rear side of said substrate.

8. The module of claim 1, further comprising a first switching device disposed adjacent to a rear side of said substrate.

9. A solar cell module, comprising:
   a substrate;
   a first solar cell supported by said substrate and having a first top side and a first rear side;
   a second solar cell supported by said substrate and having a second top side and a second rear side, said second solar cell being operatively adjacent said first solar cell;
   a first tab affixed to said first top side and operatively interfacing with said first rear side;
   a second tab affixed to said second top side and operatively interfacing with said second rear side;
   a bonding element disposed between said substrate and first and second rear sides, wherein said bonding element directly bonds (a) said substrate to said first and second rear sides and (b) said substrate to said first and second tabs; and
   a first metal trace element disposed directly between said substrate and said bonding element, said first metal trace element electrically connecting one of said first and second top sides to one of said first and second rear sides.

10. The module of claim 9, further comprising a bypass diode disposed on one of said first and second rear sides.

11. The module of claim 10, wherein said bypass diode is disposed between said first tab and said first rear side.

12. The module of 9, further comprising a bypass diode disposed on a side of said substrate opposite said first and second rear sides.

13. The module of claim 9, further comprising a first switching device disposed on one of said first and second rear sides.

14. The module of claim 13, wherein said switching device is disposed between said first tab and said first rear side.

15. The module of claim 9, further comprising a first switching device disposed on a side of said substrate opposite said first and second rear sides.

16. The module of claim 12, further comprising a second metal trace element disposed between said bypass diode and said substrate.

17. The module of claim 16, further comprising:
a third metal trace element disposed on a side of said substrate opposite said first and second solar cells; and
a third tab electrically connected to said third metal trace element and said bypass diode.

18. The module of claim 9, further comprising a plurality of conducting elements positioned between said first metal trace element and said first and second rear sides.

19. The module of claim 18, wherein at least one of said conducting elements is in electrical contact with said first tab.

20. The module of claim 9, wherein said bonding element directly bonds said first tab to said first rear side.

21. The module of claim 9, wherein said bonding element is disposed between said first tab and first metal trace element.

22. The module of claim 9, wherein said bonding element comprises an adhesive layer having a plurality of openings.

23. The module of claim 22, wherein said openings allow for electrical connection between said first metal trace element and said first and second solar cells.

24. The module of claim 9, wherein said substrate comprises a dielectric film.

25. The module of claim 9, wherein said substrate comprises one of a glass fiber, a woven fiber and a carbon fiber.

* * * * *